United States Patent
Son (10) Patent No.: US 10,056,193 B1
(45) Date of Patent: Aug. 21, 2018

(54) MULTILAYER CERAMIC ELECTRONIC COMPONENT AND BOARD HAVING THE SAME MOUNTED THEREON

(71) Applicant: SAMSUNG ELECTRO-MECHANICS CO., LTD., Suwon-Si, Gyeonggi-Do (KR)

(72) Inventor: Soo Hwan Son, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/704,909

(22) Filed: Sep. 14, 2017

(30) Foreign Application Priority Data

Feb. 22, 2017 (KR) .................. 10-2017-0023722

(51) Int. Cl.
| | |
|---|---|
| *H01G 4/30* | (2006.01) |
| *H01G 4/248* | (2006.01) |
| *H01G 4/06* | (2006.01) |
| *H05K 1/18* | (2006.01) |

(52) U.S. Cl.
CPC .............. *H01G 4/30* (2013.01); *H01G 4/06* (2013.01); *H01G 4/248* (2013.01); *H05K 1/181* (2013.01); *H05K 2201/10015* (2013.01)

(58) Field of Classification Search
CPC ............ H01G 4/30; H01G 4/06; H01G 4/248; H05K 1/181
USPC ......................................................... 174/260
See application file for complete search history.

(56) References Cited

U.S. PATENT DOCUMENTS

| 9,928,957 B2 | 3/2018 | Park et al. |
| 2015/0014038 A1 | 1/2015 | Park et al. |
| 2016/0203914 A1* | 7/2016 | Park ................... H05K 1/111 |
| | | 174/260 |

(Continued)

FOREIGN PATENT DOCUMENTS

| JP | 2000-182888 A | 6/2000 |
| JP | 2000-223375 A | 8/2000 |

(Continued)

OTHER PUBLICATIONS

Korean Office Action issued in corresponding Korean Application No. 10-2017-0023722, dated Jan. 11, 2018.

*Primary Examiner* — Timothy Thompson
*Assistant Examiner* — Charles Pizzuto
(74) *Attorney, Agent, or Firm* — McDermott Will & Emery LLP (57) ABSTRACT

A multilayer ceramic electronic component includes a multilayer ceramic capacitor including a ceramic body, and external electrodes disposed on first and second end surfaces of the ceramic body. First and second metal frames are each disposed along a respective one of two end surfaces of the multilayer ceramic capacitor, the first and second metal frames each disposed along upper and lower surfaces of the multilayer ceramic capacitor. An insulating cover encloses the multilayer ceramic capacitor and upper portions of the first and second metal frames. Lateral portions of the first and second metal frames disposed along end surfaces of the multilayer ceramic capacitor are in contact with the insulating cover, and lower portions of the first and second metal frames disposed along lower surfaces of the multilayer ceramic capacitor are spaced apart from the insulating cover by an interval.

14 Claims, 7 Drawing Sheets

(56) References Cited

U.S. PATENT DOCUMENTS

2016/0211075 A1    7/2016  Park
2016/0343506 A1*  11/2016  Lee ........................ H01G 4/005
2017/0164479 A1*  6/2017  Park ........................ H05K 1/181

FOREIGN PATENT DOCUMENTS

| | | |
|---|---|---|
| JP | 2004-266110 A | 9/2004 |
| JP | 2016-134620 A | 7/2016 |
| JP | 10-2016-0139409 A | 12/2016 |
| KR | 10-2015-0006623 A | 1/2015 |

\* cited by examiner

MULTILAYER CERAMIC ELECTRONIC COMPONENT AND BOARD HAVING THE SAME MOUNTED THEREON

CROSS-REFERENCE TO RELATED APPLICATION

This application claims the benefit of priority to Korean Patent Application No. 10-2017-0023722, filed on Feb. 22, 2017 with the Korean Intellectual Property Office, the entirety of which is incorporated herein by reference.

BACKGROUND

The present disclosure relates to a multilayer ceramic electronic component and a board having the same mounted thereon.

Multilayer ceramic capacitors (MLCCs), types of multilayer electronic component, are used in various types of electronic apparatuses due to inherent advantages thereof, such as small size, high capacitance, and ease of mounting.

Meanwhile, with the electrification of vehicles, the electronic control of such vehicles has become popular. As a result, the number of electrical control units (ECUs) mounted in such vehicles has increased. Further, operation control systems have increased in complexity due to the need for communications and networking between ECUs. Ultimately, each ECU that is directly associated with the safety performance of a vehicle requires high degrees of reliability and durability.

Such ECUs are used in environments in which temperatures are high, sudden changes in temperature can occur, and the ECUs may be exposed to mechanical stresses such as vibrations and shocks for an extended period of time.

The ECUs may each contain one or more MLCCs having excellent thermal or electrical reliability.

Such MLCCs may each include a stack of a plurality of dielectric layers, as well as internal electrodes alternately disposed between the dielectric layers and having different polarities through the stack.

Here, since the dielectric layers respectively have piezoelectric properties, when a direct current (DC) or alternating current (AC) voltage is applied to the MLCC, a piezoelectric phenomenon may occur between the internal electrodes, in which periodic vibrations are generated while the volume of a ceramic body is expanded and contracted, depending on the frequency of the voltage applied thereto.

Such vibrations may be transferred to a board through external electrodes of the MLCC and solders connecting the external electrodes to the board, such that the entirety of the board may act as a sound reflecting surface to generate vibration sound, experienced by users as noise.

The vibration sound may correspond to an audio frequency within a range of 20 Hz to 20,000 Hz, causing listener discomfort. The vibration sound causing listener discomfort, as described above, is known as acoustic noise.

Such acoustic noise may cause a reduction in quality of devices.

Meanwhile, as causes of defects in MLCCs, there may be cracking, or the like, due to the mechanical stress resulting from the vibrations described above. As a result, external moisture may permeate into the MLCC, and thus a level of insulating resistance may be reduced and the ECU may fail or otherwise stop operating.

Thus, a need exists for improving the reliability of MLCCs used in ECUs.

SUMMARY

An aspect of the present disclosure may provide a multilayer ceramic electronic component capable of reducing acoustic noise and increasing reliability of an electronic component, and a board having the same mounted thereon.

According to an aspect of the present disclosure, a multilayer ceramic electronic component includes: a multilayer ceramic capacitor including a ceramic body, and external electrodes disposed on first and second end surfaces of the ceramic body, the ceramic body having a plurality of dielectric layers and first and second internal electrodes alternately disposed between pairs of adjacent dielectric layers of the plurality of dielectric layers; first and second metal frames respectively disposed along first and second end surfaces of the multilayer ceramic capacitor, the first and second metal frames each being disposed along portions of upper and lower surfaces of the multilayer ceramic capacitor; and an insulating cover enclosing the multilayer ceramic capacitor and upper portions of the first and second metal frames. Lateral portions of the first and second metal frames disposed along end surfaces of the multilayer ceramic capacitor are in contact with the insulating cover, and lower portions of the first and second metal frames disposed along lower surfaces of the multilayer ceramic capacitor are spaced apart from the insulating cover by an interval.

According to another aspect of the present disclosure, a board assembly having a multilayer ceramic electronic component may include: a board having first and second electrode pads mounted thereon; and the multilayer ceramic electronic component mounted on the first and second electrode pads. The first and second metal frames are connected to the first and second electrode pads, respectively.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element, or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated, listed items.

It will be apparent that, although the terms 'first,' 'second,' 'third,' etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" or the like, may be used herein for ease of description to describe one element's relationship relative to another element(s), as shown in the figures. It will be understood that spatially relative terms are intended to encompass different orientations of the device in use or operation, in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations, depending on a particular directional orientation of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape resulting from manufacturing. The following embodiments may also be constituted alone or as a combination of several or all thereof.

The contents of the present disclosure described below may have a variety of configurations, and only a required configuration is proposed herein, but the present disclosure is not limited thereto.

Figure 1:
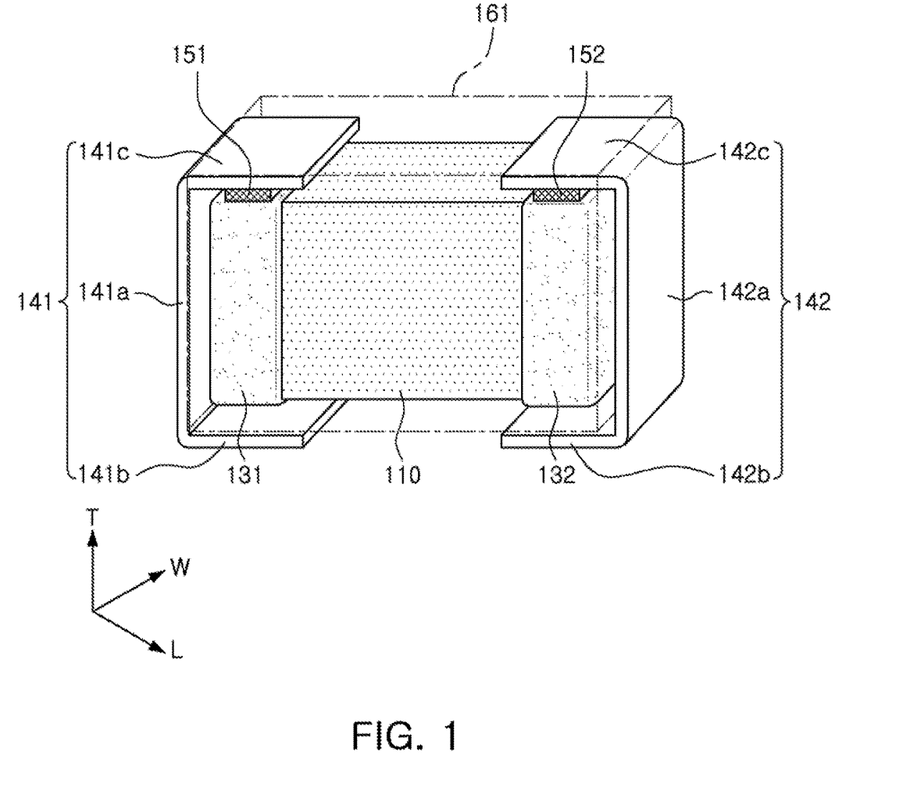
FIG. 1 is a perspective view schematically illustrating a multilayer ceramic electronic component according to an exemplary embodiment.

FIG. 1 is a perspective view schematically illustrating a multilayer ceramic electronic component according to an exemplary embodiment.

Referring to FIG. 1, the multilayer ceramic electronic component may include a multilayer ceramic capacitor, including a ceramic body 110 and first and second external electrodes 131 and 132, first and second metal frames 141 and 142, and an insulating cover 161, enclosing the multilayer ceramic capacitor and upper portions of the first and second metal frames 141 and 142.

In the exemplary embodiment, the ceramic body 110 may be formed by stacking a plurality of dielectric layers 111 (refer to FIG. 5) in a thickness direction of the ceramic body 110 and then sintering the dielectric layers 111.

The respective adjacent dielectric layers 111 of the ceramic body 110 may be integrated with each other, so that boundaries therebetween may not be readily confirmed.

Further, the ceramic body 110 may have a hexahedral shape. However, the present disclosure is not limited thereto.

Directions of a hexahedron of the ceramic body 110 will be defined in order to more clearly describe exemplary embodiments. L, W, and T directions, depicted in FIG. 1, refer to a length direction, a width direction, and a thickness direction, respectively. A lower surface may be defined as a mounting surface, and an upper surface may be defined as opposing the mounting surface.

Further, cover layers, having a predetermined thickness, may be disposed above an upper surface of an internal electrode positioned uppermost in the ceramic body 110 and below a lower surface of an internal electrode positioned lowermost in the ceramic body 110, respectively.

The cover layer may be formed of the same composition as the dielectric layers 111, and may be formed by stacking at least one dielectric layer that does not include an internal electrode on upper and lower surfaces of the ceramic body 110, respectively.

In the exemplary embodiment, the first and second metal frames 141 and 142 may have an approximately U shape.

The first and second metal frames 141 and 142 may include first and second terminal parts 141b and 142b disposed on a mounting surface of the ceramic body 110 and serving as a terminal for mounting on a board; first and second horizontal parts 141c and 142c opposing the first and second terminal parts 141b and 142b with the ceramic body 110 disposed therebetween and connected to the first and second external electrodes 131 and 132, respectively, on a surface of the ceramic body 110 opposite the mounting surface; and first and second vertical parts 141a and 142a connecting the first and second horizontal parts 141c and 142c to the first and second terminal parts 141b and 142b, respectively.

Further, the first and second terminal parts 141b and 142b may be subjected to surface treatment such as nickel (Ni)/tin (Sn) plating and/or Ni/gold (Au) plating, if desired, so that a contact feature with solders may be excellent at the time of mounting the multilayer ceramic capacitor on the board.

In the exemplary embodiment, the first and second horizontal parts 141c and 142c that are the upper portions of the first and second metal frames 141 and 142 may be electrically connected to the first and second external electrodes 131 and 132 of the multilayer ceramic capacitor by first and second conductive adhesives 151 and 152, respectively.

In an exemplary embodiment, the first and second vertical parts 141a and 142a that are lateral portions of the first and second metal frames 141 and 142 may be spaced apart from the first and second external electrodes 131 and 132, respectively.

Further, the first and second terminal parts 141b and 142b that are lower portions of the first and second metal frames 141 and 142 may be spaced apart from the first and second external electrodes 131 and 132, respectively.

Thus, the first and second metal frames 141 and 142 may have a structure in which only the first and second horizontal parts 141c and 142c that are the upper portions of the first and second metal frames 141 and 142 may be attached to the first and second external electrodes 131 and 132, respectively, to reduce an area for transferring the vibrations of the first and second external electrodes 131 and 132, thus further reducing acoustic noise.

Further, the first and second metal frames 141 and 142 may absorb mechanical stress due to the deformation of the mounting board by elastic force and reduce the transfer of mechanical stress from the board to the ceramic body 110, so as to prevent defects or damage such as cracking in the ceramic body 110 caused by mechanical stress, thus increasing reliability.

Further, according to the exemplary embodiment, even in the case that an interval between the first and second terminal parts 141b and 142b of the first and second metal frames 141 and 142 and the first and second external electrodes 131 and 132 is set to be a significantly reduced value, sufficient elastic force may be obtained from the first and second metal frames 141 and 142. Thus, a height of the multilayer ceramic electronic component may be reduced further than that of the existing metal frame product in which the interval between the lower terminal part and the lower surface of the multilayer ceramic capacitor is large.

Plating layers (not illustrated) may be formed on the first and second metal frames 141 and 142.

Examples of the plating layers may include first and second Ni plating layers respectively formed on the first and second metal frames 141 and 142, and first and second Sn plating layers respectively formed on the first and second Ni plating layers.

Other examples of the plating layers may include first and second Ni plating layers respectively formed on the first and second metal frames 141 and 142, and first and second Au plating layers respectively formed on the first and second Ni plating layers.

Figure 2A:
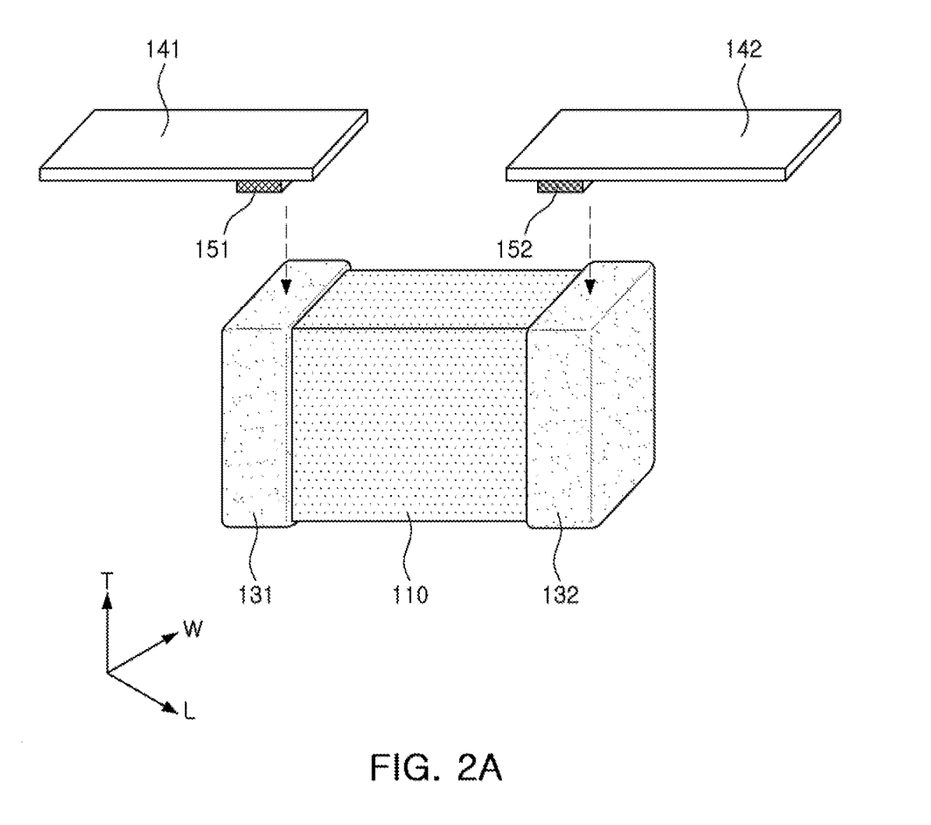
FIGS. 2A through 2C are perspective views illustrating respective operations of a process of manufacturing the multilayer ceramic electronic component of FIG. 1.
Figure 2B:
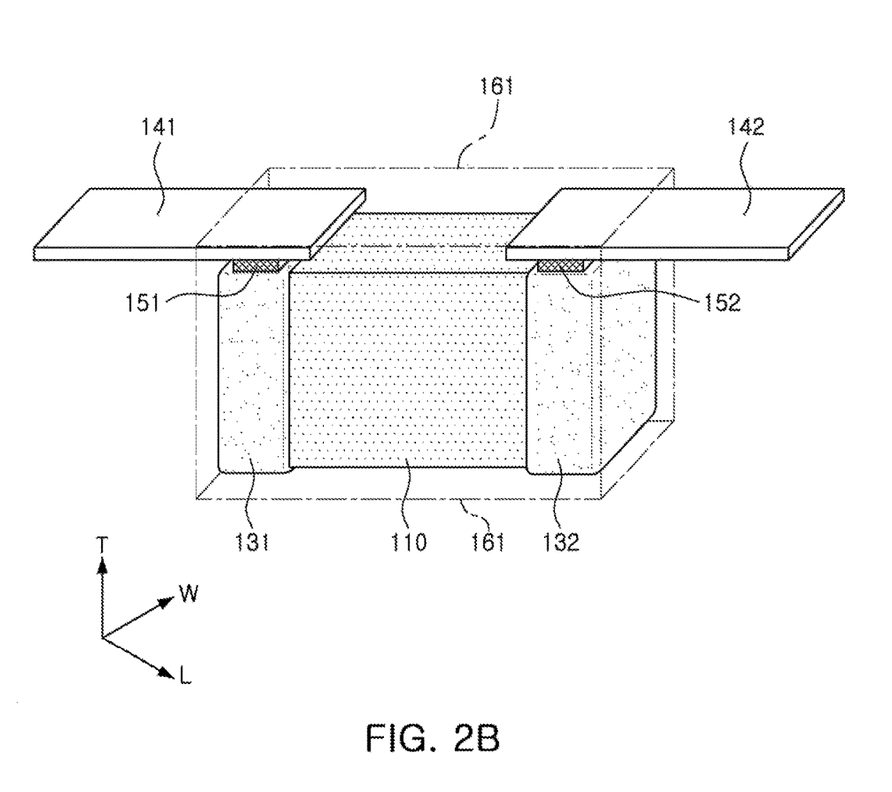
Figure 2C:
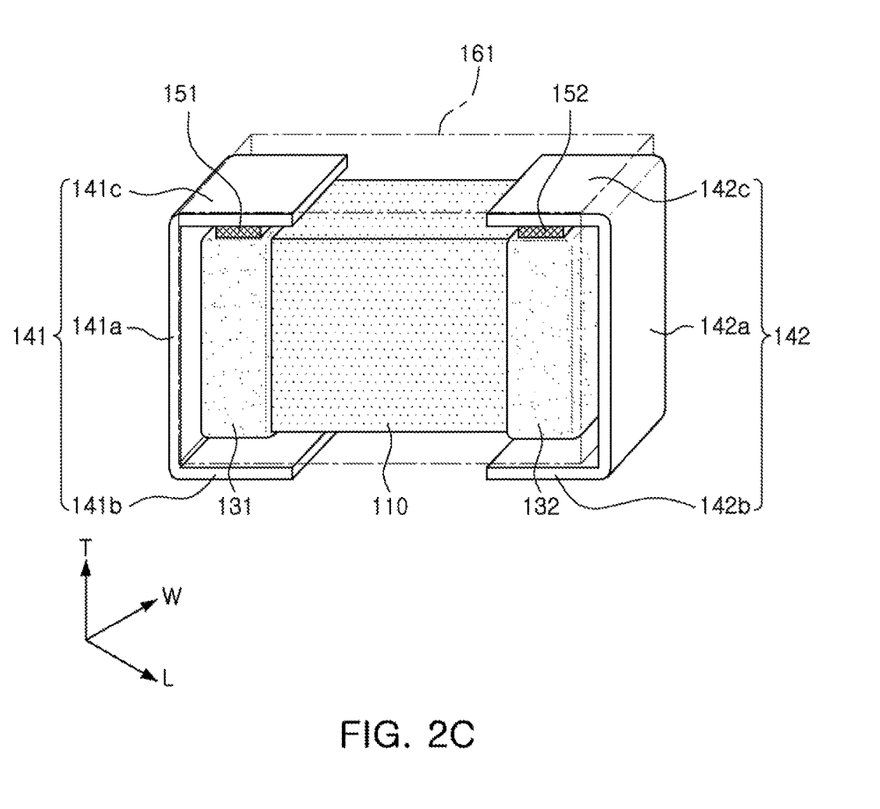

FIGS. 2A through 2C are perspective views illustrating respective operations of a process of manufacturing the multilayer ceramic electronic component of FIG. 1.

Referring to FIG. 2A, lower surfaces of the first and second metal frames 141 and 142 may have the first and second conductive adhesives 151 and 152, respectively, applied thereto. The first and second conductive adhesives 151 and 152 may be electrically connected to upper surfaces of the external electrodes 131 and 132, respectively, of the multilayer ceramic capacitor, including the first and second external electrodes 131 and 132 disposed on both end surfaces of the ceramic body 110 in the length direction.

As the first and second conductive adhesives 151 and 152, a conductive resin paste may be used, but the present disclosure is not limited thereto. For example, soldering in a high temperature state may also be used.

Referring to FIG. 2B, the insulating cover 161 may be formed or disposed to enclose the multilayer ceramic capacitor and the upper portions of the upper portions of the first and second metal frames 141 and 142. The insulating cover 161 may be formed using an insulating material to cover the multilayer ceramic capacitor having the first and second external electrodes 131 and 132 connected by the first and second conductive adhesives 151 and 152 to the first and second metal frames 141 and 142.

The insulating material may be formed of a thermosetting resin such as an epoxy resin, but the present disclosure is not limited thereto.

Referring to FIG. 2C, the first and second metal frames 141 and 142 may be bent along the insulating cover 161 to form lateral and lower portions of the first and second metal frames 141 and 142.

Accordingly, a cross section of each of the first and second metal frames 141 and 142 may have an approximately U shape.

Figure 3:
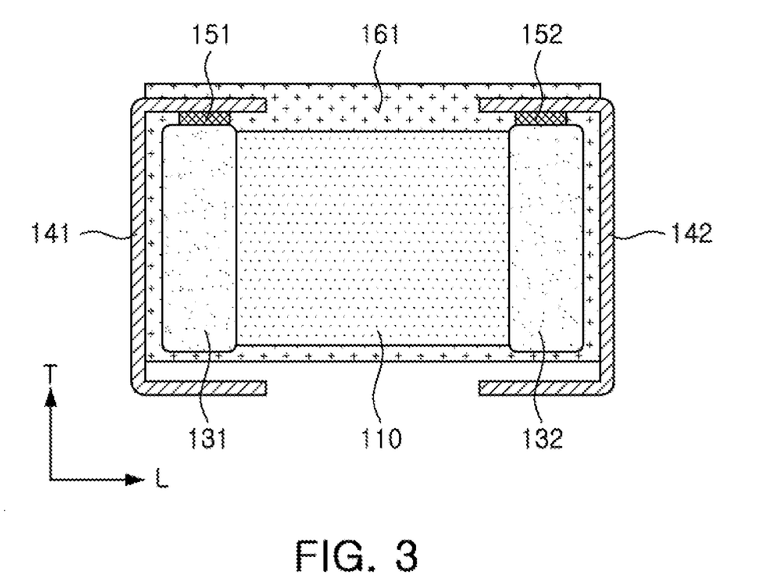
FIG. 3 is a cross-sectional view illustrating an interior of the multilayer ceramic electronic component of FIG. 1.

FIG. 3 is a cross-sectional view illustrating an interior of the multilayer ceramic electronic component of FIG. 1.

Referring to FIG. 3, the insulating cover 161 may be formed or disposed to enclose the multilayer ceramic capacitor and the upper portions of the first and second metal frames 141 and 142, while the first and second external electrodes 131 and 132 of the multilayer ceramic capacitor are connected to the first and second metal frames 141 and 142 by the first and second conductive adhesives 151 and 152.

The insulating cover 161 may enclose the multilayer ceramic capacitor and the first and second horizontal parts 141c and 142c that are the upper portions of the first and second metal frames 141 and 142. The first and second terminal parts 141b and 142b and the first and second vertical parts 141a and 142a that are the lower and lateral portions of the first and second metal frames 141 and 142 may be exposed externally.

In an exemplary embodiment, the first and second vertical parts 141a and 142a that are the lateral portions of the first and second metal frames 141 and 142 may be in contact with the insulating cover 161.

Further, the first and second terminal parts 141b and 142b that are the lower portions of the first and second metal frames 141 and 142 may be spaced apart from the insulating cover 161 by a predetermined interval.

According to an exemplary embodiment, the first and second vertical parts 141a and 142a that are the lateral portions of the first and second metal frames 141 and 142 may be in contact with the insulating cover 161. In contrast, the first and second terminal parts 141b and 142b that are the lower portions of the first and second metal frames 141 and 142 may be spaced apart from the insulating cover 161 by the predetermined interval, thus reducing acoustic noise.

The first and second terminal parts 141b and 142b are spaced apart from end surfaces of the multilayer ceramic capacitor, and the insulating cover 161 fills a space between the first and second terminal parts 141b and 142b and the end surfaces of the multilayer ceramic capacitor.

A structure, according to an exemplary embodiment, may have a better acoustic noise reduction effect than a common multilayer ceramic capacitor having no conventional metal frame, a structure to which only a metal frame is applied, and a structure to which a metal frame and an insulating cover are applied and in which lateral and lower portions of the metal frame are spaced apart from the insulating cover by a predetermined interval.

Further, according to an exemplary embodiment, the multilayer ceramic capacitor may be wrapped with an insulating resin to form the insulating cover 161 to prevent external moisture from permeating into the multilayer ceramic capacitor, thus increasing moisture resistance properties of the multilayer ceramic capacitor.

According to an exemplary embodiment, the first and second metal frames 141 and 142 may be formed of a material having a Young's modulus within a range of 50 GPa to 200 GPa.

Thus, mechanical strength may be excellent while reducing acoustic noise.

When the first and second metal frames 141 and 142 have a Young's modulus of 50 GPa or less, an acoustic noise reduction effect may be excellent due to good vibration absorption capabilities, but mechanical strength may be low.

When the first and second metal frames 141 and 142 have a Young's modulus greater than 200 GPa, the acoustic noise reduction effect may be low due to reduced vibration absorption capabilities.

Figure 4:
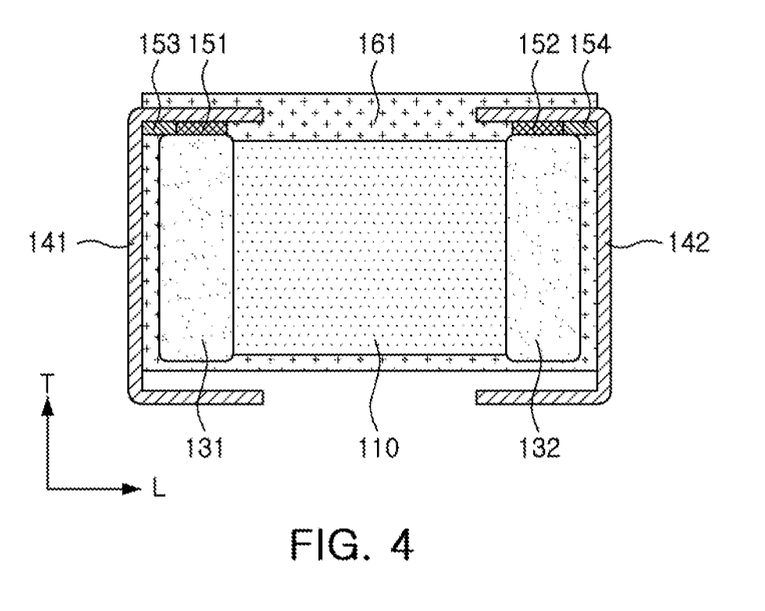
FIG. 4 is a cross-sectional view illustrating an interior of a multilayer ceramic electronic component according to another exemplary embodiment.

FIG. 4 is a cross-sectional view illustrating an interior of a multilayer ceramic electronic component according to another exemplary embodiment.

Referring to FIG. 4, the multilayer ceramic electronic component, according to another exemplary embodiment, may have additional first and second solder paste layers 153 and 154 respectively interposed between end portions of the insulating cover 161 and the conductive adhesives 151 and 152.

The first and second solder paste layers 153 and 154 may be further inserted to further increase the sealability of the multilayer ceramic electronic component according to another exemplary embodiment, thus achieving better moisture resistance properties.

Figure 5:
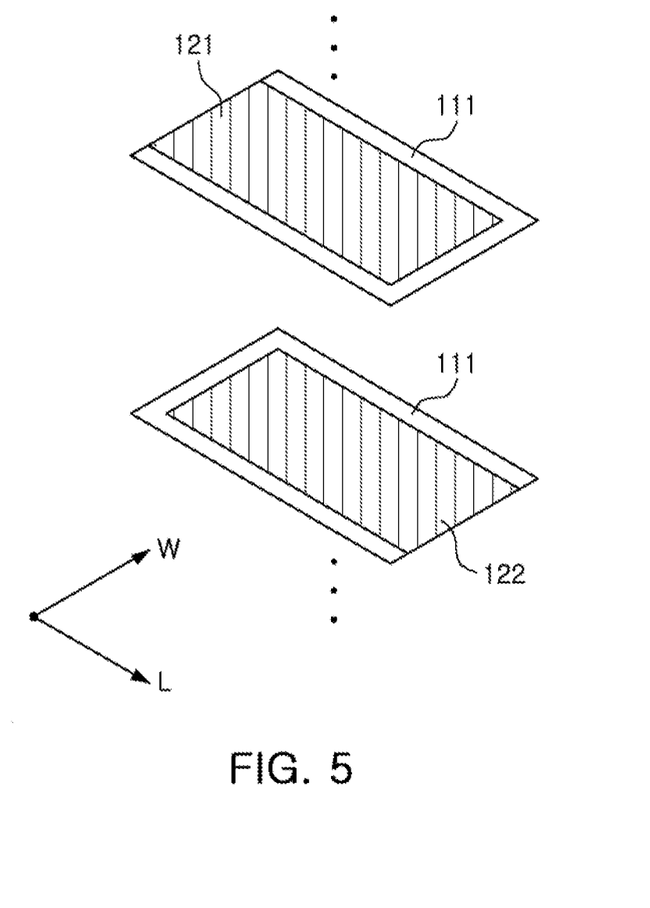
FIG. 5 is an exploded perspective view schematically illustrating an example of an internal electrode disposition structure in a multilayer ceramic electronic component according to an exemplary embodiment.

FIG. 5 is an exploded perspective view schematically illustrating an example of an internal electrode disposition structure of a multilayer ceramic electronic component according to an exemplary embodiment.

A thickness of one dielectric layer 111 may be arbitrarily changed depending on a capacitance design of the multilayer ceramic capacitor. Further, the dielectric layer 111 may contain a high-k ceramic material, for example, a $BaTiO_3$-based ceramic powder, or the like. However, the present disclosure is not limited thereto.

Examples of the $BaTiO_3$-based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, and $Ba(Ti_{1-y}Zr_y)O_3$ in which calcium (Ca), zirconium (Zr), or the like is partially dissolved in $BaTiO_3$, but the present disclosure is not limited thereto.

The dielectric layer 111 may further contain a ceramic additive, an organic solvent, a plasticizer, a binder, a dispersant, or the like, in addition to the ceramic powder.

As the ceramic additive, for example, at least one of a transition metal oxide, a carbide, a rare earth element, magnesium (Mg), aluminum (Al), or the like may be used.

As illustrated in FIG. 5, first and second internal electrodes 121 and 122 may alternately be formed on adjacent ceramic sheets, forming the dielectric layers 111, may be stacked in the thickness direction, and may then be sintered, such that the first and second internal electrodes 121 and 122 may alternately be disposed in the ceramic body 110 with each of the dielectric layers 111 interposed therebetween.

The first and second internal electrodes 121 and 122, having different polarities, may oppose each other in a direction in which the dielectric layers 111 are stacked, and may be electrically insulated from each other by the dielectric layers 111 disposed therebetween.

One end portion of each first internal electrode 121 may be exposed through one end surface of the ceramic body 110, and one end portion of each second internal electrode 122 may be exposed through the other end surface of the ceramic body 110 opposite to the one end surface in the length direction of the ceramic body 110.

The end portions of the first and second internal electrodes 121 and 122 alternately exposed through both end surfaces of the ceramic body 110 in the length direction, as described above, may respectively be electrically connected to the first and second external electrodes 131 and 132 disposed on both end surfaces of the ceramic body 110 in the length direction.

Hereinafter, the first and second external electrodes 131 and 132 may be separately termed the first external electrode 131 and the second external electrode 132.

Here, the first and second internal electrodes 121 and 122 may be formed of a conductive metal, for example, a material such as Ni, a Ni alloy, or the like. However, the present disclosure is not limited thereto.

According to the configuration as described above, when predetermined levels of voltages are applied to the first and second external electrodes 131 and 132, electric charges may be accumulated on the first and second internal electrodes 121 and 122 opposing each other.

Here, a capacitance of the multilayer ceramic capacitor may be proportional to an area of a region in which the first and second internal electrodes 121 and 122 are overlapped with each other in the direction in which the dielectric layers 111 are stacked.

Meanwhile, the exemplary embodiment illustrates a horizontal stack type multilayer ceramic capacitor in which the first and second internal electrodes 121 and 122 are stacked in the thickness direction of the ceramic body 110 that is parallel to the mounting surface, but the present disclosure is not limited thereto.

The first and second external electrodes 131 and 132 may be formed by sintering conductive pastes for forming external electrodes containing copper (Cu), in order to have good electrical properties and provide high reliability such as excellent heat cycle resistance, moisture resistance, and the like. However, the present disclosure is not limited thereto.

Plating layers (not illustrated) may be formed on the first and second external electrodes 131 and 132.

Examples of the plating layers may include first and second Ni plating layers respectively formed on the first and second metal frames 131 and 132, and first and second Sn plating layers respectively formed on the first and second Ni plating layers.

Table 1 below illustrates the results of comparison between an acoustic noise value according to an example and acoustic noise values according to Comparative Examples 1 to 3.

An example of an exemplary embodiment illustrates a structure which includes a multilayer ceramic capacitor, first and second metal frames, and an insulating cover, and in which lateral portions of the first and second metal frames are in contact with the insulating cover, and lower portions of the first and second metal frames are spaced apart from the insulating cover by a predetermined interval.

Comparative Example 1 is a structure as a conventional multilayer ceramic capacitor, having no metal frame and insulating cover.

Comparative Example 2 is a structure in which only a metal frame is disposed on a multilayer ceramic capacitor.

Comparative Example 3 is a structure in which a metal frame and an insulating cover are disposed on a multilayer ceramic capacitor, and lateral and lower portions of the metal frame are spaced apart from the insulating cover by a predetermined interval.

The multilayer ceramic capacitor, used in the tests, a product having a 3225 size (length×width×thickness, 3.2 mm×2.5 mm×2.5 mm) and a capacitance of 220 μF that was subjected to the test.

TABLE 1

| | Acoustic Noise Value (dBA) |
|---|---|
| Example | 25 |
| Comparative Example 1 | 40.0 |
| Comparative Example 2 | 35 |
| Comparative Example 3 | 31.0 |

Referring to Table 1 above, it can be seen that the example in which the lateral portions of the first and second metal frames are in contact with the insulating cover and the lower portions thereof are spaced apart from the insulating cover by the predetermined interval has an acoustic noise reduction effect better than those of Comparative Examples 1 to 3.

Figure 6:
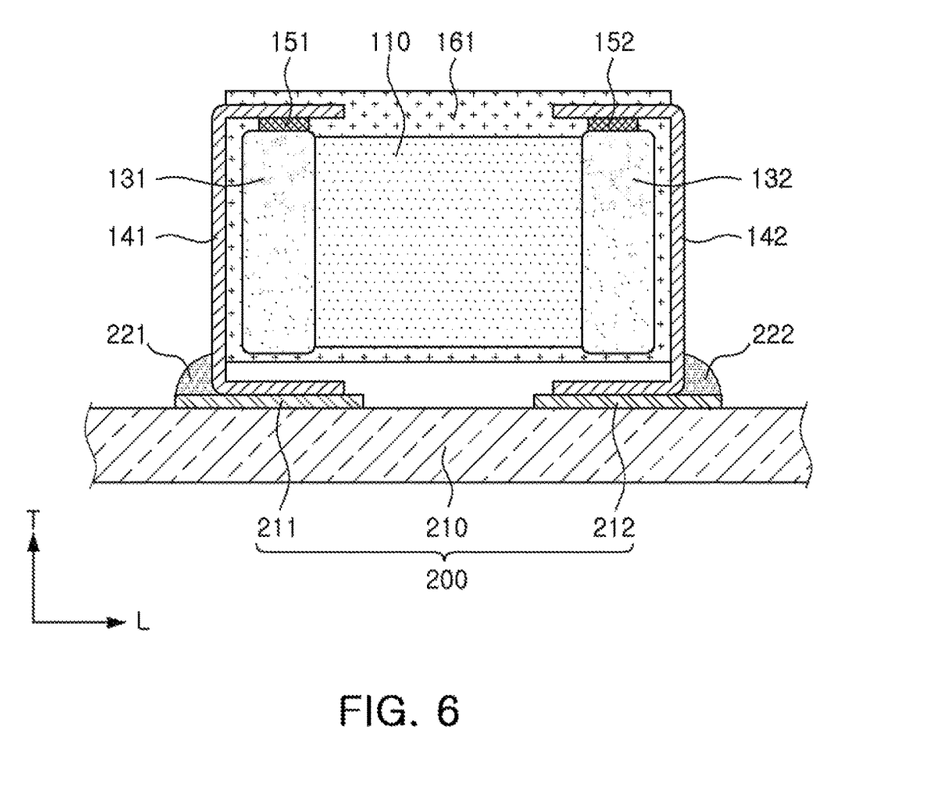
FIG. 6 is a cross-sectional view illustrating a board assembly having a multilayer ceramic electronic component according to an exemplary embodiment.

FIG. 6 is a cross-sectional view illustrating a board assembly 200 having a multilayer ceramic electronic component according to an exemplary embodiment.

Referring to FIG. 6, the board assembly 200, having the multilayer ceramic electronic component according to the exemplary embodiment, may include a board 210 on which the multilayer ceramic electronic component is mounted, and first and second electrode pads 211 and 212 formed on an upper surface of the board 210 to be spaced apart from each other in the length direction.

While first and second terminal parts 141b and 142b of first and second metal frames 141 and 142 disposed on a lower surface of a ceramic body 110 are respectively connected to the first and second electrode pads 211 and 212 on the board 210, multilayer ceramic electronic components may be bonded by first and second solders 221 and 222 to be electrically connected to each other.

As described above, when voltages having different polarities are applied to first and second external electrodes 131 and 132 of the multilayer ceramic capacitor through the first and second metal frames 141 and 142 with the multilayer electronic component mounted on the board 210, an inverse piezoelectric effect of the dielectric layer may cause the ceramic body 110 to expand and contract in the thickness direction, and both end portions of the first and second external electrodes 131 and 132 may contract and expand as opposed to the expansion and the contraction of the ceramic body 110 in the thickness direction due to the Poisson effect.

The above-mentioned expansion and contraction of the ceramic body 110 may generate vibrations which may be transferred to the board 210 through the first and second external electrodes 131 and 132 to radiate sound from the board 210, experienced as acoustic noise.

According to the exemplary embodiment, the piezoelectric vibrations, transferred to the board 210 through the first and second external electrodes 131 and 132 of the multilayer ceramic capacitor, may be absorbed or attenuated by the elasticity of the first and second metal frames 141 and 142, and mechanical stress, generated due to warpage of the board 210, or the like, may also be absorbed by the first and second metal frames 141 and 142, thus reducing the acoustic noise of the product.

In particular, first and second vertical parts 141a and 142a that are lateral portions of the first and second metal frames 141 and 142 may be in contact with an insulating cover 161. In contrast, the first and second terminal parts 141b and 142b that are lower portions of the first and second metal frames 141 and 142 may be spaced apart from the insulating cover 161 by a predetermined interval, thus achieving a better acoustic noise reduction effect.

Further, because the first and second metal frames 141 and 142 absorb the mechanical stress, the stress may not be transferred to the multilayer ceramic capacitor, thus preventing damage such as cracking.

Further, the multilayer ceramic capacitor may be covered with an insulating resin, thus increasing moisture resistance properties.

As set forth above, according to the exemplary embodiments, since a metal frame may absorb mechanical stress, the stress may not be transferred to a multilayer ceramic capacitor (MLCC), thus preventing damage such as cracking.

Further, the MLCC may be covered with an insulating resin, thus increasing moisture resistance properties.

Further, the elasticity of the metal frame may absorb vibrations transferred through an external electrode of a ceramic body, thus reducing acoustic noise.

While exemplary embodiments have been shown and described above, it will be apparent to those skilled in the art that modifications and variations could be made without departing from the scope of the present disclosure, as defined by the appended claims.

What is claimed is:

1. A multilayer ceramic electronic component, comprising:
   a multilayer ceramic capacitor including a ceramic body, and external electrodes disposed on first and second end surfaces of the ceramic body, the ceramic body having a plurality of dielectric layers and first and second internal electrodes alternately disposed between pairs of adjacent dielectric layers of the plurality of dielectric layers;
   first and second metal frames respectively disposed along first and second end surfaces of the multilayer ceramic capacitor, the first and second metal frames each being disposed along portions of upper and lower surfaces of the multilayer ceramic capacitor; and
   an insulating cover enclosing the multilayer ceramic capacitor and upper portions of the first and second metal frames,
   wherein lateral portions of the first and second metal frames disposed along the first and second end surfaces of the multilayer ceramic capacitor are in contact with the insulating cover, and lower portions of the first and second metal frames disposed along the lower surfaces of the multilayer ceramic capacitor are spaced apart from the insulating cover by an interval.

2. The multilayer ceramic electronic component of claim 1, wherein the first and second metal frames include:
   first and second terminal parts disposed along a mounting surface of the ceramic body;
   first and second horizontal parts opposing the first and second terminal parts with the ceramic body disposed therebetween, and each connected to a respective one of the external electrodes on a surface of the ceramic body opposite the mounting surface; and
   first and second vertical parts connecting the first and second terminal parts to the first and second horizontal parts, respectively.

3. The multilayer ceramic electronic component of claim 1, wherein an upper portion of each of the first and second metal frames is connected to a respective one of the external electrodes of the multilayer ceramic capacitor by a conductive adhesive.

4. The multilayer ceramic electronic component of claim 3, wherein a solder paste layer is interposed between an end portion of the insulating cover and the conductive adhesive.

5. The multilayer ceramic electronic component of claim 1, wherein the lateral and lower portions of the first and second metal frames disposed along the end surfaces and lower surfaces of the multilayer ceramic capacitor are bent along the insulating cover.

6. The multilayer ceramic electronic component of claim 1, wherein the first and second metal frames each have a Young's modulus within a range from 50 GPa to 200 GPa.

7. The multilayer ceramic electronic component of claim 1, wherein the lateral portions of the first and second metal frames are spaced apart from the first and second end surfaces of the multilayer ceramic capacitor, and the insulating cover fills a space between the lateral portions of the first and second metal frames and the first and second end surfaces of the multilayer ceramic capacitor.

8. A board assembly having a multilayer ceramic electronic component, comprising:
   a board having first and second electrode pads mounted thereon; and
   the multilayer ceramic electronic component of claim 1 mounted on the first and second electrode pads,
   wherein the first and second metal frames are connected to the first and second electrode pads, respectively.

9. The board assembly of claim 8, wherein the first and second metal frames include:
   first and second terminal parts disposed along a mounting surface of the ceramic body;
   first and second horizontal parts opposing the first and second terminal parts with the ceramic body disposed therebetween, and each connected to a respective one of external electrodes on another surface of the ceramic body opposite the mounting surface; and
   first and second vertical parts connecting the first and second terminal parts to the first and second horizontal parts, respectively.

10. The board assembly of claim 8, wherein an upper portion of each of the first and second metal frames is connected to a respective one of the external electrodes of the multilayer ceramic capacitor by a conductive adhesive.

11. The board assembly of claim 10, wherein a solder paste layer is interposed between an end portion of the insulating cover and the conductive adhesive.

12. The board assembly of claim 8, wherein the lateral and lower portions of the first and second metal frames disposed along the end surfaces and lower surfaces of the multilayer ceramic capacitor are bent along the insulating cover.

13. The board assembly of claim 8, wherein the first and second metal frames each have a Young's modulus within a range from 50 GPa to 200 GPa.

14. The board assembly of claim 8, wherein the lateral portions of the first and second metal frames are spaced apart from the first and second end surfaces of the multilayer ceramic capacitor, and the insulating cover fills a space between the lateral portions of the first and second metal frames and the first and second end surfaces of the multilayer ceramic capacitor.

* * * * *